US008698567B2

(12) United States Patent
Thelen et al.

(10) Patent No.: US 8,698,567 B2
(45) Date of Patent: Apr. 15, 2014

(54) PHASE-LOCKED LOOP CALIBRATION SYSTEM AND METHOD

(75) Inventors: Robert Thelen, Fort Collins, CO (US); Michael Farmer, Fort Collins, CO (US); Robert K. Barnes, Fort Collins, CO (US)

(73) Assignee: Avago Technologies General IP (Singapore) Pte. Ltd., Singapore (SG)

(*) Notice: Subject to any disclaimer, the term of this patent is extended or adjusted under 35 U.S.C. 154(b) by 96 days.

(21) Appl. No.: 13/437,662

(22) Filed: Apr. 2, 2012

(65) Prior Publication Data
US 2013/0257497 A1 Oct. 3, 2013

(51) Int. Cl.
*H03L 7/085* (2006.01)
*H03L 7/081* (2006.01)
*H03L 7/091* (2006.01)

(52) U.S. Cl.
USPC ............... 331/44; 331/11; 331/18; 331/25; 327/156; 332/128; 375/376

(58) Field of Classification Search
USPC .............. 327/147, 156; 331/1 A, 1 R, 10, 11, 331/16–18, 25, 44; 332/127, 128; 375/373, 375/375, 376
See application file for complete search history.

(56) References Cited

U.S. PATENT DOCUMENTS

| 5,036,294 | A  | * | 7/1991  | McCaslin .............. 331/1 A |
| 5,742,208 | A  | * | 4/1998  | Blazo .................... 331/23 |
| 7,095,287 | B2 | * | 8/2006  | Maxim et al. ........... 331/44 |
| 7,177,611 | B2 | * | 2/2007  | Goldman ............... 455/260 |
| 7,352,249 | B2 | * | 4/2008  | Balboni et al. .......... 331/16 |
| 7,369,002 | B2 | * | 5/2008  | Spijker et al. .......... 331/17 |
| 7,382,200 | B2 |   | 6/2008  | Staszewski et al. |
| 7,420,427 | B2 |   | 9/2008  | Brown et al. |
| 7,486,147 | B2 | * | 2/2009  | Khorram ................ 331/16 |
| 7,786,913 | B2 | * | 8/2010  | Waheed et al. ......... 341/143 |
| 7,791,428 | B2 |   | 9/2010  | Chang et al. |
| 8,031,008 | B2 |   | 10/2011 | Wang et al. |
| 8,044,724 | B2 |   | 10/2011 | Rao et al. |
| 8,432,203 | B2 | * | 4/2013  | Pialis et al. ............ 327/156 |
| 8,493,113 | B2 | * | 7/2013  | Ferriss et al. .......... 327/156 |
| 2008/0315958 | A1 | * | 12/2008 | Takahashi et al. ...... 331/17 |
| 2011/0215848 | A1 | * | 9/2011  | Koroglu et al. ........ 327/157 |
| 2012/0242383 | A1 | * | 9/2012  | Elad et al. ............. 327/156 |

OTHER PUBLICATIONS

Alvin L.S. Loke, et al., "A Versatile 90-nm CMOS Charge-Pump PLL for SerDes Transmitter Clocking," IEEE Journal of Solid-State Circuits, vol. 41, No. 8, Aug. 2006.

* cited by examiner

*Primary Examiner* — Levi Gannon

(57) ABSTRACT

In a phase-locked loop (PLL) calibration system and method, the PLL input reference clock is phase-modulated, the resulting PLL output modulation is measured, and PLL calibration signals, such as a PLL proportional path adjustment signal and a PLL integral path adjustment signal, are derived from the measured PLL output modulation.

20 Claims, 6 Drawing Sheets

PHASE-LOCKED LOOP CALIBRATION SYSTEM AND METHOD

BACKGROUND

A phase-locked loop (PLL) is a control system that generates an output signal having a phase that is related to the phase of an input reference signal. As PLLs are commonly used in clocked circuits, the input reference signal is often referred to as a reference clock. In its most straightforward form, a PLL comprises a phase-frequency detector (PFD), a loop filter, a voltage-controlled oscillator (VCO), and a frequency divider. The PFD compares the frequency of the input reference clock with the frequency of a feedback signal. The phase error signal resulting from this comparison is provided to the loop filter, which is commonly implemented as a charge pump, and the output of the loop filter drives the VCO. The output of the VCO serves not only as the output of the PLL but also as the aforementioned feedback signal.

A PLL design is characterized by, among other design parameters, a certain bandwidth and certain amount of peaking. The bandwidth of a PLL is a measure of the extent to which the PLL can track the input reference clock phase. A high-bandwidth PLL can achieve phase lock faster than a low-bandwidth PLL and can advantageously track jitter in the reference clock. A low-bandwidth PLL filters jitter in the input reference clock to a greater extent than a high-bandwidth PLL but takes longer to achieve phase lock than a high-bandwidth PLL. As illustrated by the exemplary phase transfer function 10 shown in FIG. 1, in the context of a PLL, "bandwidth" most commonly refers to the portion of the PLL frequency response between a minimum operational frequency and a frequency at which the frequency response falls 3 decibels (dB) below a peak frequency response 12. This point is commonly referred to as the "3 dB point," and the PLL bandwidth may alternatively be referred to as the 3 dB bandwidth. Note in FIG. 1 that the PLL output phase accurately tracks the reference clock phase over a substantial range of frequencies, but at frequencies above peak frequency response 12, the magnitude of the PLL output phase signal becomes increasingly attenuated with further increase in frequency. In the context of a PLL, the term "peaking" refers to a measure of the extent to which the peak frequency response 12 exceeds the frequency response over the range of frequencies at which the PLL output phase accurately tracks the reference clock phase.

A dual-path PLL is similar to the above-described single-path PLL, but the PFD output is provided to two paths: a proportional path and an integral path. Each path has a separate loop filter. The VCO combines the outputs of the two paths. Each loop filter (charge pump) can be tuned or adjusted. The PLL bandwidth or 3 dB point can be set by adjusting the proportional path gain. The amount of PLL peaking can be set by adjusting the integral path gain.

Semiconductor fabrication process tolerances are so wide that it is difficult to fabricate a PLL having desired or target values of bandwidth and peaking. Calibration techniques have been used in attempts to more accurately set such PLL parameters to desired or target values.

SUMMARY

Embodiments of the invention relate to a phase-locked loop (PLL) calibration system and method in which the PLL input reference clock is phase-modulated (i.e., jittered in a controlled manner) and the resulting PLL output modulation is measured, and PLL calibration signals are derived from the measured PLL output modulation. The PLL calibration signals can be provided to adjustment signal inputs of the PLL, such as a proportional path adjustment signal input and an integral path adjustment signal input.

In an exemplary embodiment, a system for calibrating a PLL comprises a clock phase modulator, a PLL output signal sampler, and calibration control logic. The clock phase modulator is configured to phase-modulate an input reference clock signal at a modulation frequency and to provide a phase-modulated reference clock signal to the PLL. The PLL output signal sampler is configured to digitally sample a PLL output signal generated by the PLL in response to the phase-modulated reference clock signal and to provide digital information indicating variation in the PLL output signal corresponding to an amount of phase modulation in the phase-modulated reference clock signal. The calibration control logic is configured to provide a measurement of phase deviation error in the PLL output signal in response to the digital information indicating variation in the PLL output signal. The calibration control logic is further configured to provide calibration signals to the PLL in response to the measurement of phase deviation error and at least one target PLL parameter provided as a calibration input.

In one aspect of the exemplary embodiment, a method for calibrating a PLL using the above-described system comprises setting the clock phase modulator to provide a phase-modulated reference clock signal having a modulation frequency corresponding to a target 3 dB bandwidth of the PLL, and providing a proportional path adjustment signal to a proportional path adjustment input of the PLL by continuing to adjust the proportional path adjustment signal and determine a measurement of phase deviation error in the PLL output signal from the digital information until it is determined that the measurement of phase deviation error in the PLL output signal substantially equals 3 dB of PLL output signal peak-to-peak amplitude.

In another aspect of the exemplary embodiment, a method for calibrating a PLL using the above-described system comprises adjusting the clock phase modulator to provide a phase-modulated reference clock signal having a modulation frequency corresponding to an inflection point in a PLL frequency response, and providing an integral path adjustment signal to an integral path adjustment input of the PLL by continuing to adjust the integral path adjustment signal and determine a measurement of phase deviation error in the PLL output signal from the digital information until it is determined that the measurement of phase deviation error in the PLL output signal substantially corresponds to a target amount of PLL peaking.

Other systems, methods, features, and advantages will be or become apparent to one with skill in the art upon examination of the following figures and detailed description. It is intended that all such additional systems, methods, features, and advantages be included within this description, be within the scope of the specification, and be protected by the accompanying claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention.

DETAILED DESCRIPTION

Figure 1:
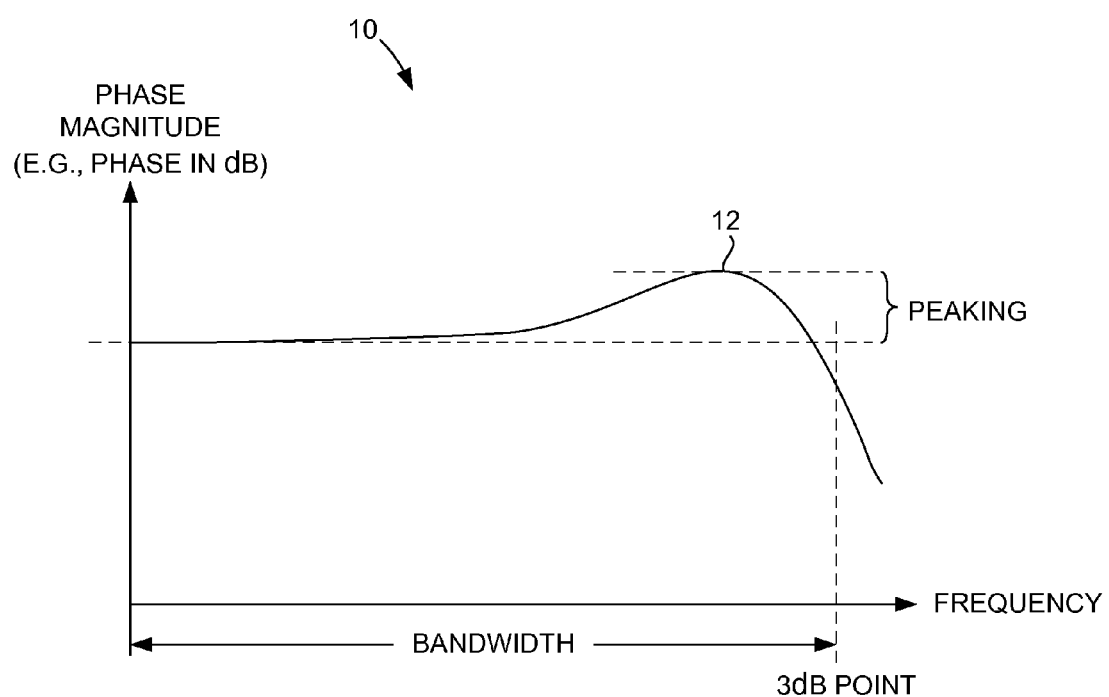
FIG. 1 is a graph of an exemplary PLL transfer function as known in the prior art.
Figure 2:
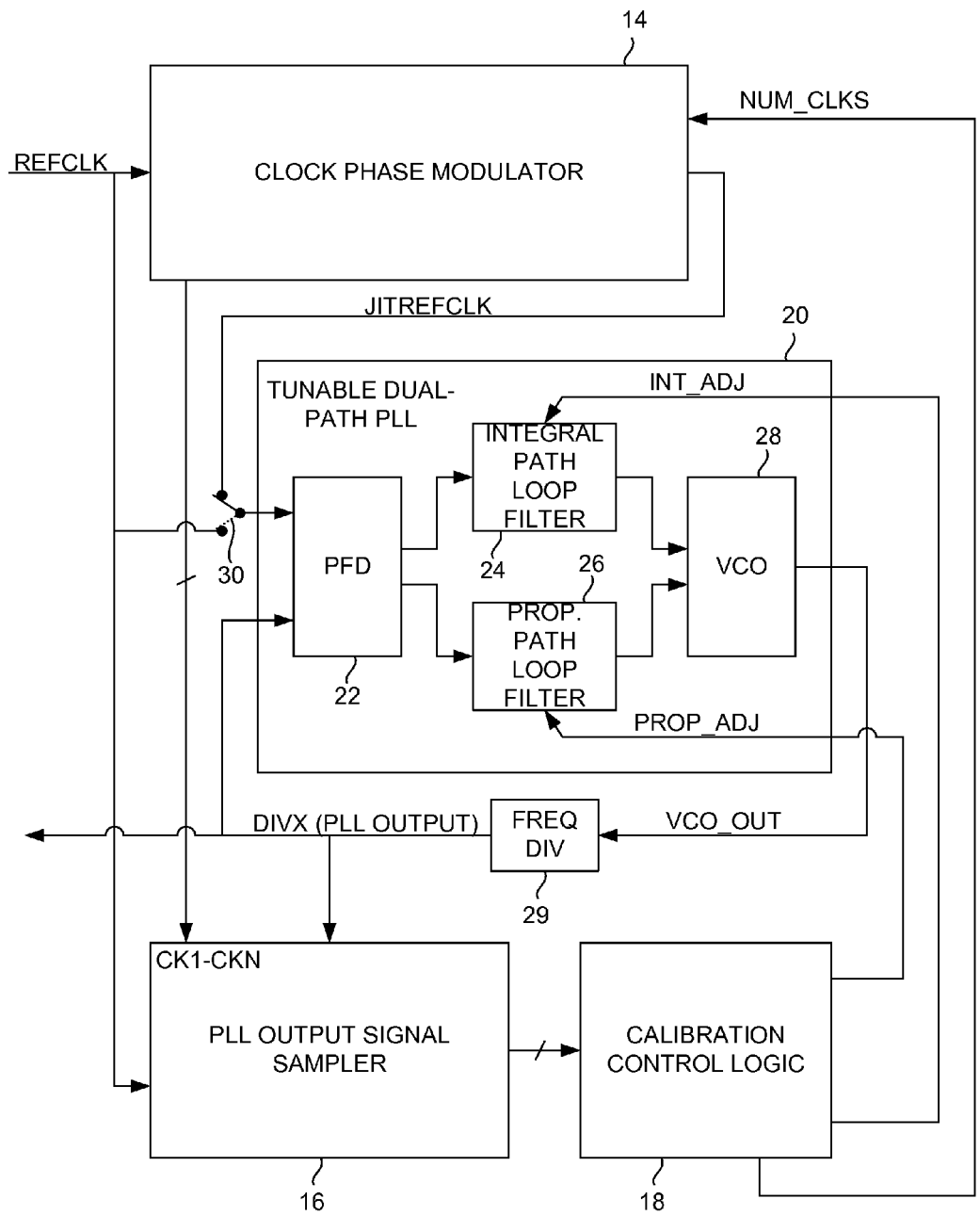
FIG. 2 is a block diagram of a PLL calibration system in accordance with an exemplary embodiment of the present invention.

As illustrated in FIG. 2, in an illustrative or exemplary embodiment of the invention, a calibration system comprises a clock phase modulator 14, a phase-locked loop output signal sampler 16, and calibration control logic 18. The calibration system is used to calibrate a tunable dual-path phase-locked loop (PLL) 20. The PLL 20 can be of a conventional type having a phase-frequency detector (PFD) 22, an integral path loop filter 24, a proportional path loop filter 26, and a voltage-controlled oscillator 28. As PLL 20 is of conventional structure in the illustrated embodiment and thus well understood by persons skilled in the art, its operation is not described in detail herein. As persons skilled in the art will appreciate, the complete PLL loop includes not only PLL 20 but also a frequency divider 29. It should be noted that integral path loop filter 24 is adjustable or tunable in response to a PLL integral path adjustment signal ("INT_ADJ"), and proportional path loop filter 26 is adjustable or tunable in response to a PLL proportional path adjustment signal ("PROP_ADJ").

The PLL 20 can be part of any suitable external system (i.e., a system of which PLL 20 is the only element shown in FIG. 2), such as, for example, a serializer-deserializer or "SerDes" circuit of a type commonly used to provide high-speed data communication. As known in the art, tight tolerances on bandwidth and peaking in a SerDes PLL promote maximum SerDes performance. Embodiments of the present invention, such as the exemplary embodiment described herein, can be employed to calibrate PLL peaking and PLL bandwidth in a SerDes circuit (not shown) or other suitable external system of which PLL 20 is a part. As used herein, the term "bandwidth" or "PLL bandwidth" includes any conventional definition of PLL bandwidth, such as the portion of the PLL frequency response between a minimum operational frequency and a frequency at which the frequency response falls 3 dB) below a peak frequency response.

The system shown in FIG. 2 can be operated in one of two selectable modes: a normal operational mode and a calibration mode. In the normal operational mode, PLL 20 receives a reference clock signal ("REFCLK") as its input and produces a PLL output signal ("DIVX"). The reference clock signal can be, for example, the reference clock signal used in an external system such as a SerDes circuit. In this normal operational mode, the PLL output signal is provided to the SerDes circuit or other external system. In the calibration mode, PLL 20 receives a phase modulated clock signal ("JITREFCLK") as its input instead of the reference clock signal that it receives in the normal operational mode, and the PLL output signal is provided to PLL output signal sampler 16. As described in further detail below, during a calibration process PLL output signal sampler 16 samples the PLL output signal. Calibration control logic 18 analyzes digital information derived from the sampled PLL output signal and, in response to the analysis, adjusts the above-referenced PLL integral path adjustment signal ("INT_ADJ") and PLL proportional path adjustment signal ("PROP_ADJ").

The system shown in FIG. 2 can be switched between the normal operational mode and the calibration mode. For example, a switch 30 that can be implemented as a multiplexer or similar two-input selector circuit can select the reference clock signal as the PLL input signal during the normal operational mode and select the phase modulated clock signal as the PLL input signal during the calibration mode. The system shown in FIG. 2 can be switched to operate in the calibration mode at any suitable time, such as upon the resetting or powering up of the external system (e.g., a SerDes circuit) with which PLL 20 is associated. After the calibration process or method described below has been performed, the system shown in FIG. 2 can be switched from the calibration mode to the normal operational mode. In the normal operational mode, PLL 20, having been calibrated, contributes a PLL function to the SerDes circuit or other external system of which it is a part.

In the exemplary embodiment, clock phase modulator 14 injects sinusoidally varying phase modulation (effectively a controlled jitter) into the reference clock signal ("REFCLK") to produce the phase modulated clock signal ("JITREFCLK") that is applied to the input of PLL 20 during calibration. Although the jitter or phase modulation is injected in a sinusoidal fashion in the exemplary embodiment, in other embodiments the jitter or phase modulation may be injected in any other suitable controlled manner.

Figure 3:
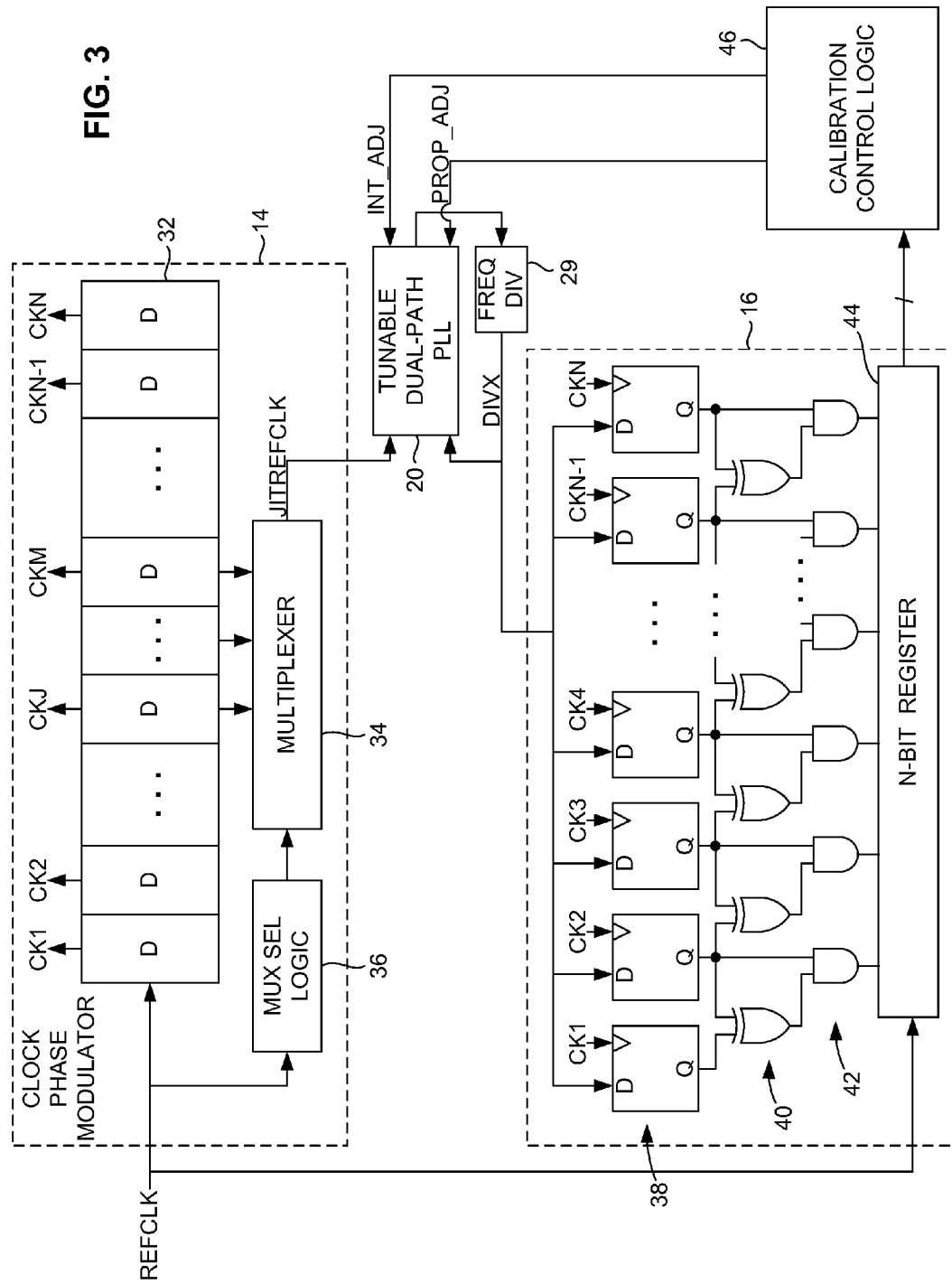
FIG. 3 is similar to FIG. 2, showing elements of the PLL calibration system in further detail.

As illustrated in FIG. 3, clock phase modulator 14 includes a delay-locked loop (DLL) 32 having N stages, a multiplexer 34, and multiplexer selection logic 36. The output of each of the N stages is a delayed version of the reference clock signal ("REFCLK"). As each of the N stages of DLL 32 contributes the same delay D (e.g., in units of nanoseconds) as the others, it can be appreciated that the delayed clock signal ("CK1") that is the output of the first DLL stage is delayed by D from the reference clock signal, the delayed clock signal ("CK2") that is the output of the second DLL stage is delayed by 2D from the reference clock signal, etc. Thus, DLL 32 produces delayed clock signals ranging from CK1 to CKN (with two arbitrary delayed clock signals CKJ and CKM that lie between CK1 and CKN also being shown in FIG. 3 for purposes of illustration). In response to signals provided by multiplexer selection logic 36, multiplexer 34 sequentially selects the outputs (i.e., delayed clock signals) of a group of DLL stages in a range between the DLL stage that produces the delayed clock signal CKJ and the DLL stage that produces the delayed clock signal CKM. The number of DLL stages in this group is referred to below as "num_stages." Multiplexer 34 can thus be referred to as a num_stages-to-one multiplexer. Although in the exemplary embodiment clock phase modulator 14 includes a DLL, in other embodiments a clock phase modulator can include any suitable alternative means for delaying the reference clock signal, such as a uniform delay line.

Although any group of DLL stage outputs can be provided as the delayed clock signal inputs to multiplexer 34, it may be advantageous to provide neither a group that includes the first few stages (i.e., those that produce delayed clock signals CK1, CK2, etc.) nor the last few stages (i.e., those that produce delayed clock signals CKN, CK(N-1), etc.) but rather to provide a group between these extremes of the DLL range. Selecting a group that lies more in the middle of DLL 32 than at the extremes leaves room at the extremes to accommodate swings in amplitude of the phase of the phase modulated clock signal ("JITREFLCK"). For example, in an embodiment in which DLL 32 has, for example, 41 stages, a group of, for example, 20 of those stages can be selected, ranging from the $10^{th}$ stage (i.e., the stage that produces delayed clock signal CK10) through the $30^{th}$ stage (i.e., the stage that produces delayed clock signal CK30). Note that in this example J=10 (i.e., CKJ=CK10) and M=30 (i.e., CKM=CK30).

The amount of phase shift that clock phase modulator 14 provides in the phase modulated clock signal, i.e., the amount by which the phase shift varies with time, can be described by the following expression:

$$A*\sin(2*\pi*f\_mod*t), \qquad \text{(Eqn. 1)}$$

where "A" is the amplitude of the phase of the phase modulated clock signal, f_mod is the modulation frequency, and t represents time. The amplitude ("A") of the phase of the phase modulated clock signal can be expressed in units of time as:

$$A=\text{num\_clks}*T/N, \qquad \text{(Eqn. 2)}$$

where num_clks is the number of cycles of the reference clock signal during which multiplexer 34 maintains its selection of one of the DLL stage outputs before selecting the next DLL stage output in the sequence, and T is the period of the reference clock signal. The amplitude ("A) of the phase of the phase modulated clock signal can also be expressed in units of DLL stages. Expressed in units of DLL stages, the amplitude ("A") of the phase of the phase modulated clock signal represents the range of DLL stages (or range of delayed clock signals) over which the phase of the phase modulated clock signal varies from its center or nominal value. Expressed in units of DLL stages, the amplitude ("A") of the phase of the phase modulated clock signal is:

$$A=\text{num\_stages}/N. \qquad \text{(Eqn. 3)}$$

The modulation frequency ("f_mod"), i.e., the frequency at which multiplexer 34 changes its selections as it sequences through the group of DLL stages, can be expressed as:

$$f\_mod=1/(\text{num\_stages}*\text{num\_clks}*T). \qquad \text{(Eqn. 4)}$$

Note that the resolution with which the calibration system can measure PLL peaking is T/N, and that the maximum PLL peaking that the system can measure is N/num_stages.

Figure 4:
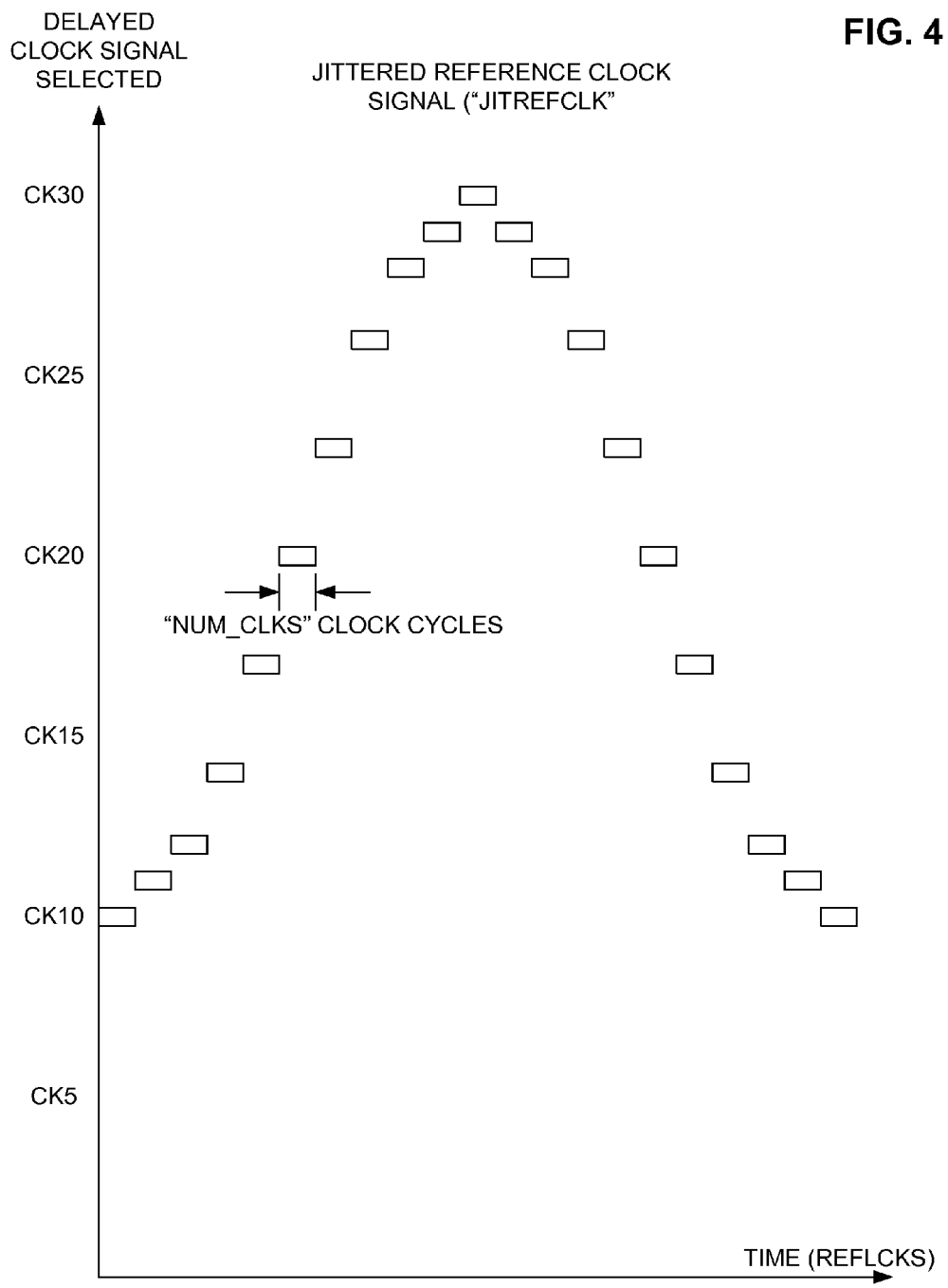
FIG. 4 is a plot illustrating an example of modulating in a sinusoidal fashion the phase of the reference clock that is provided to the PLL of FIGS. 2-3.

An example shown in FIG. 4, in which DLL 14 has 41 stages (i.e., N=41), illustrates how multiplexer 34 can sequentially select the outputs (i.e., delayed clock signals) of a group of those 41 DLL stages so as to cause the phase modulated reference clock that multiplexer 34 outputs to vary in phase in a sinusoidal manner. In this example, the group of DLL stages ranges between the DLL stage that produces the delayed clock signal CK10 and the DLL stage that produces the delayed clock signal CK30. Providing this exemplary group to multiplexer 34 thus reserves the delayed clock signals CK1-CK9 and CK31-CK41 at the extremes of the DLL range to accommodate the above-referenced swings in amplitude of the phase of the phase modulated clock signal. In this example, the sequence can be: CK10, CK11, CK12, CK14, CK17, CK20, CK23, CK26, CK28, CK29, CK30, CK29, CK28, CK26, CK23, CK20, CK17, CK14, CK12, CK11, CK10. Note that there are 11 selected DLL stage outputs in this exemplary sequence, including the peak DLL stage output ("CK30"), yielding a value of 11 for num_stages. From Equation (3), it can be seen that the amplitude ("A") of the phase of the phase modulated clock would be 11/41 DLL stages. Also note that each time multiplexer 34 selects one of the DLL stage outputs in this sequence, multiplexer 34 remains at that selection for num_clks cycles of the reference clock signal before selecting the next DLL stage output in the sequence. For example, multiplexer 34 can maintain each selection for 10 cycles of the reference clock signal. This duration is indicated in a generalized manner by the elongated shape of each of the plotted points in FIG. 4.

As noted above, the number ("num_clks") of cycles of the reference clock signal during which multiplexer 34 maintains its selection of each DLL stage output in the group determines the modulation frequency ("f_mod"). Providing for illustrative purposes that the reference clock has a frequency of, for example, 100 MHz and thus has a period ("T") of 10 ns, the modulation frequency in this example can be computed from Equation (4):

$$f\_mod=1/(11*10*10\text{ ns})=909\text{ kHz}.$$

In view of the equations and examples above, persons skilled in the art can readily provide suitable multiplexer selection logic 36 that is configured to cause multiplexer 34 to switch in a sequence such as the exemplary sequence described above. Moreover, in view of the equations and examples above, persons skilled in the art understand the design parameters such as frequencies, resolutions, DLL length ("N"), and group of DLL stages ("num_stages"), that may be useful in order to calibrate PLL 20 for use in normal operational mode in a contemplated type of external circuit, such as a SerDes circuit.

Referring again to FIG. 3, in the exemplary embodiment PLL output signal sampler 16 includes N flip-flops 38, N-1 two-input exclusive-OR (XOR) gates 40, N-1 two-input AND gates 42, and an N-bit wide register 44. All flip-flops 38 receive the PLL output signal ("DIVX") at their data inputs. Each flip-flop 38 receives a corresponding one of the delayed clock signals ("CK1"-"CKN") at its clock input. Each XOR gate 40 receives the outputs of the pair of flip-flops 38 that are clocked by the two delayed clock signals that are separated by a delay of "D." For example, a first XOR gate 40 receives the outputs of the pair of flip-flops 38 that are clocked by the first delayed clock signal ("CK1") and the second delayed clock signal ("CK1"), while a second XOR gate 40 receives the outputs of the pair of flip-flops 38 that are clocked by the second delayed clock signal ("CK2") and the third delayed clock signal ("CK3"), etc. Each AND gate 42 receives the output of one of XOR gates 40 connected to a pair of flip-flops 38 and an output of (only) one of flip-flops 38 of that pair. The output of each AND gate 42 is clocked into N-bit register 44 in response to the reference clock. Stated another way, an $n^{th}$ one of XOR gates 40 receives the outputs of the $n^{th}$ and $(n+1)^{th}$ flip-flops 38, where n is an index integer corresponding to the sequence of delayed clock signals (i.e., CK1, ... CKn, CKn+1, ... CKN). An $n^{th}$ one of AND gates 42 receives the output of the $n^{th}$ XOR gate 40 and the output of the $(n+1)^{th}$ flip-flop 38. The output of each AND gate 42 is clocked into N-bit register 44 in response to the reference clock signal.

The PLL output signal sampler 16 samples the PLL output signal ("DIVX"). The above-described modulation of the reference clock signal moves the rising edge of the PLL output signal in a sinusoidal fashion relative to the delayed clock signals ("CK1"-"CKN"). A sequence of rising edges of the delayed clock signals (i.e., CK1, CK2, CK3, ... CKN) occurs every cycle of the reference clock. The combinational logic circuit defined by the combination of XOR gates 40 and AND gates 42 identifies the rising edge of the PLL output signal. The sequential or staged rising edges of the delayed clock signals thus strobe flip-flops 38 in a sequenced manner that tracks the rising edge of the PLL output signal. By tracking the rising edge of the PLL output signal, peak-to-peak phase deviation error is measured, and consequently the PLL phase transfer function at the modulation frequency is measured. The peak-to-peak phase deviation error is equivalent to the magnitude of the PLL phase transfer function at the modulation frequency. Determining the PLL phase transfer function effectively closes the calibration loop around PLL 20 and allows both PLL bandwidth and PLL peaking to be driven to target or desired values as described below in connection with the calibration method.

Figure 5:
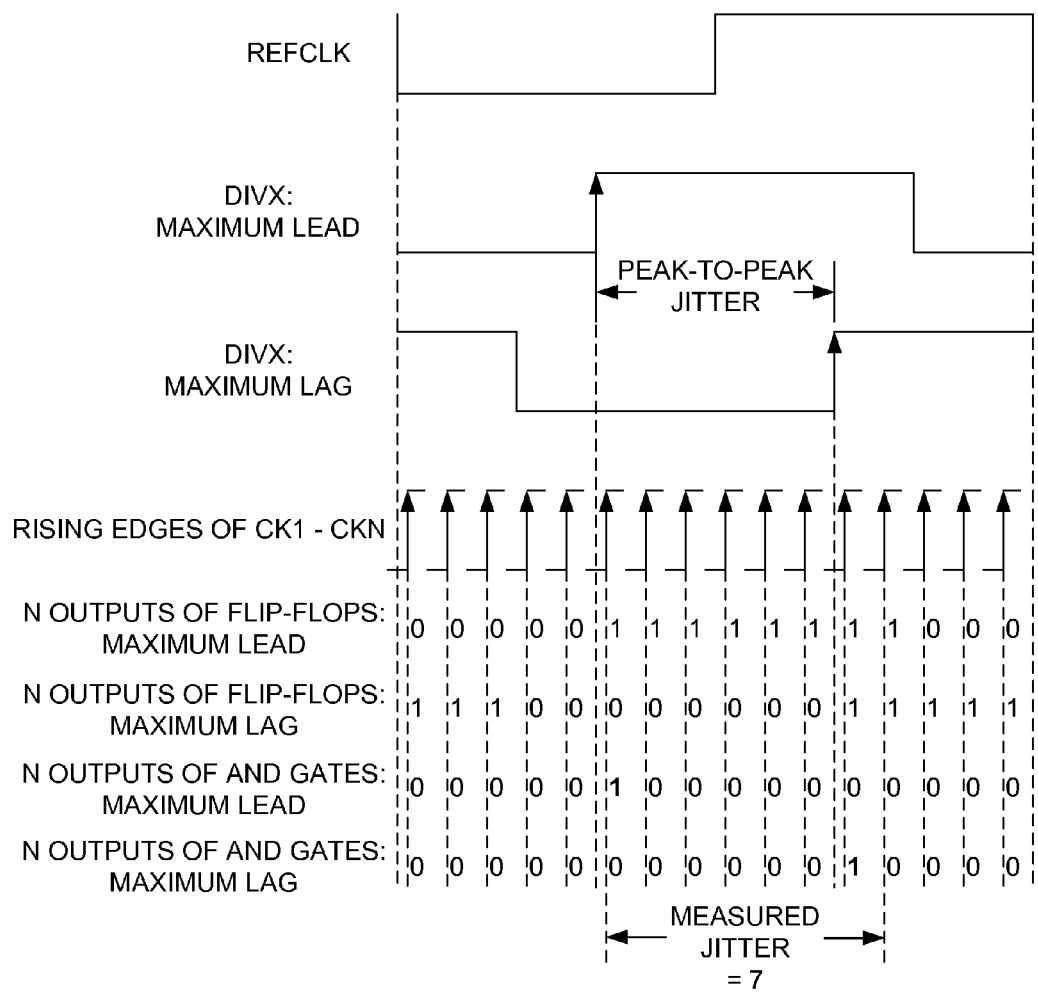
FIG. 5 is a timing diagram illustrating sampling of the PLL output signal and tracking of the rising edge of the PLL output signal using digital logic.

In the manner illustrated in FIG. 5, calibration control logic 46 can read the bits that have been clocked into N-bit register 44 and use that information to determine the maximum variation or jitter or phase deviation between rising edges of the PLL output signal during a modulation cycle. As the PLL output signal ("DIVX") tracks the phase modulated reference clock signal ("JITREFCLK"), the rising edge of the PLL output signal passes through a maximum lead position and a maximum lag position relative to the reference clock ("REFLCLK"), as shown in FIG. 5. The staged or sequential rising edges of the delayed clock signals (i.e., CK1, CK2, CK3, . . . CKN) are represented by arrows in FIG. 5. Flip-flops 38 capture both transitions of the PLL output signal from low ("0") to high ("1") and transitions from high ("1") to low ("0"). Note that when the PLL output signal transitions from low ("0") to high ("1") as it passes through the maximum lead position, one of the flip-flops 38 that had until then been holding a "0" captures a "1", and accordingly, a corresponding one of AND gates 42 outputs a "1", indicated in boldface in FIG. 5. Calibration control logic 46 can read N-bit register 44 at such a time and determine which bit position contains this "1" that corresponds to the maximum lead position. Similarly, when the PLL output signal transitions from low ("0") to high ("1") as it passes through the maximum lag position, one of the flip-flops 38 that had until then been holding a "0" captures a "1", and accordingly, a corresponding one of AND gates 42 outputs a "1", also indicated in boldface in FIG. 5. Calibration control logic 46 can read N-bit register 44 at such a time and determine which bit position contains this other "1" that corresponds to the maximum lag position. The number of bit positions or delayed clock rising edges between the "1" that indicates the maximum lead position and the "1" that indicates the maximum lag position is a measure of the phase deviation error in the PLL output signal. In the example shown in FIG. 5, seven bit positions separate the two boldface "1"s, indicating a measured phase deviation error value of seven.

Figure 6:
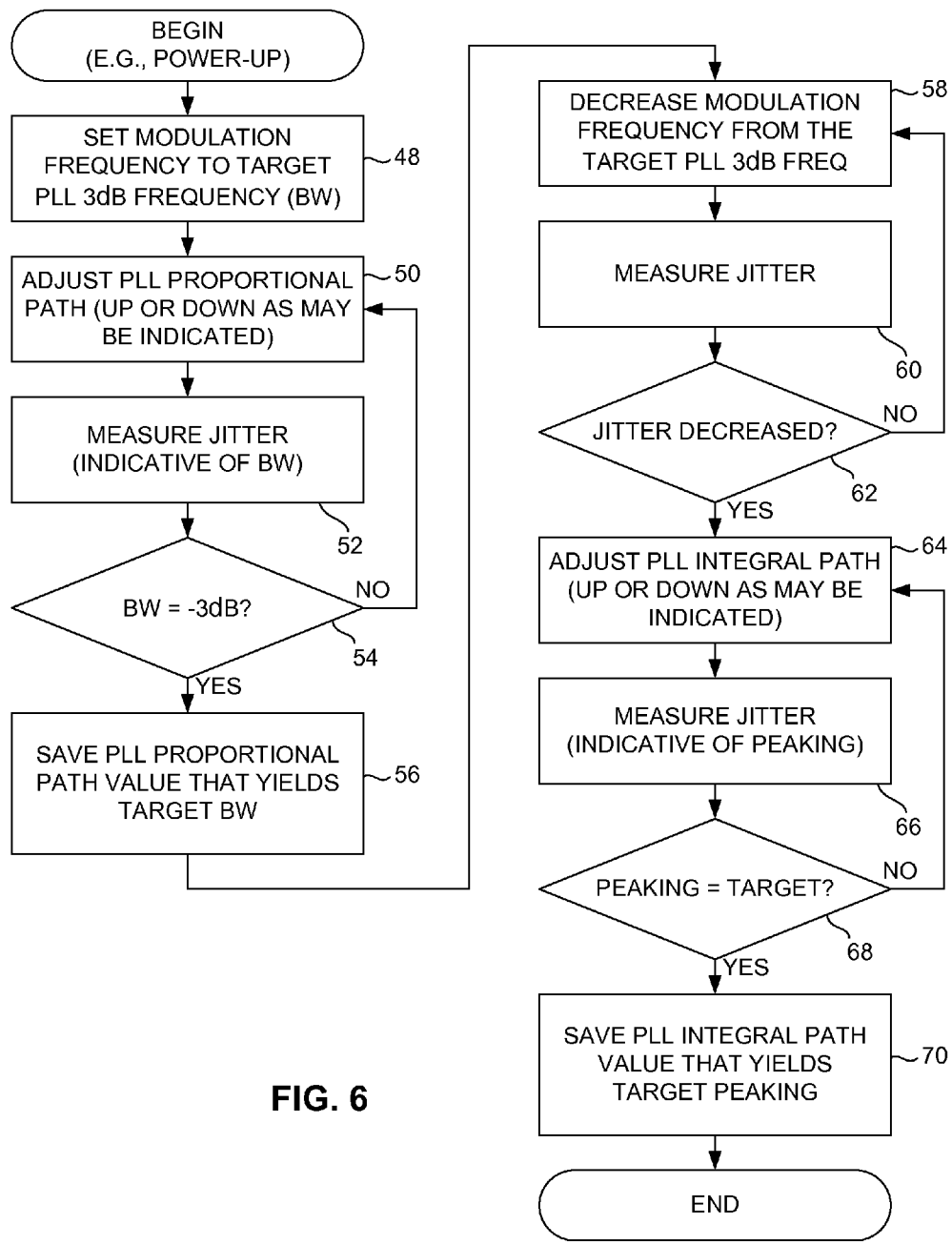
FIG. 6 is a flow diagram illustrating a method for calibrating a PLL in the system of FIGS. 2-3.

As illustrated in FIG. 6, an exemplary method for calibrating PLL 20 can be performed under the control of calibration control logic 18 (FIGS. 2-3). That is, calibration control logic 18 can be configured with suitable control logic, such as a programmed processor system, that effects or brings about the method steps. For purposes of clarity, such a processor and associated memory and other elements of calibration control logic 18 are not separately shown. Nevertheless, in view of the descriptions herein, persons skilled in the art understand how to configure or program (e.g., in processor firmware) calibration control logic 18 to operate in accordance with the method described herein. Although calibration control logic 18 is shown in FIGS. 2-3 for purposes of clarity in the exemplary embodiment as a separate and distinct element from others that may be involved in the system, it should be understood that the above-referenced external system, such as a SerDes circuit, may include its own processor or other logic in which the logic ascribed herein to calibration control logic 18 can be incorporated in other embodiments.

Calibration control logic 18 can cause the system to enter the calibration mode and initiate the exemplary method at any suitable time, such as during a reset or initialization process. For example, calibration control logic can initiate the method in response to detecting an initial application of power (commonly referred to as a "power-up" or "power-on" event) to the system shown in FIGS. 2-3. Power signals are not shown in FIGS. 2-3 for purposes of clarity, but calibration control logic 18 includes power-on detection circuitry. Also not shown for purposes of clarity is a connection between calibration control logic 18 and switch 30 in FIG. 2, but it should be understood that calibration control logic 18 or other suitable logic can cause switch 30 to switch the input of PLL 20 from the reference clock to the phase modulated reference clock before initiating the calibration method and switch the input of PLL 20 back to the reference clock upon completion of the calibration method. Switch 30 is not shown in FIG. 3 for purposes of clarity in describing the calibration-related elements.

As indicated by block 48 in FIG. 6, calibration control logic 18 can set the modulation frequency to a target frequency at which the PLL 3 dB point is to be set. Calibration control logic 18 can evaluate Equation (4) for the value of "num_clks" in response to the target frequency and then provide the result to clock phase modulator 14. As described above with regard to Equation (4), the number of clock cycles ("num_clks") for which multiplexer selection logic 36 remains at each selection determines the modulation frequency that is reflected in the phase modulated reference clock signal ("JITREFCLK").

As indicated by block 50, calibration control logic 18 can then adjust the PLL proportional path adjustment signal ("PROP_ADJ") to adjust PLL bandwidth. As indicated by block 52, with the PLL proportional path adjustment signal adjusted to a certain value, calibration control logic 18 measures the resulting phase deviation error as described above with regard to FIGS. 3 and 5. In the example described above with regard to FIG. 5, the measured phase deviation error value was seven. However, the measured phase deviation error value will depend on, among other things, the number of DLL stages ("N") in a given embodiment of the calibration system. The PLL proportional path adjustment signal will yield the target PLL bandwidth when the measured phase deviation error value corresponds to −3 dB or 0.707(2A). In the example described above with regard to FIG. 5, in which the peak-to-peak amplitude ("2A") in units of DLL stages is 20, −3 dB corresponds to 0.707(20) or 14 (rounded to the nearest integer).

As indicated by block 54, calibration control logic 18 determines if the measured phase deviation error value corresponds to −3 dB. If the measured phase deviation error value does not correspond to −3 dB, then calibration control logic 18 again adjusts the PLL proportional path adjustment signal (block 50). Although not shown for purposes of clarity, persons skilled in the art will understand that calibration control logic 18 can adjust the PLL proportional path adjustment signal up or down by a suitable increment, depending upon the result of the comparison indicated by block 54. That is, although for purposes of clarity block 54 indicates a straightforward comparison for equality of two values, persons skilled in the art understand that the comparison can result in a determination of whether the measured phase deviation error value is greater than −3 dB, less than -3dB or substantially equal to -3dB. (The term "substantially equal" refers to being equal within a measurement tolerance that has no significant effect on the desired operation.) If the measured phase deviation error value is greater than −3 dB, then the next adjustment of the PLL proportional path adjustment signal indicated by block 50 would be upward because the PLL bandwidth (as represented by the 3 dB point) is below the target. If the measured phase deviation error value is less than −3 dB, then the next adjustment of the PLL proportional path adjustment signal indicated by block 50 would be downward because the PLL bandwidth (as represented by the 3 dB point) is above the target. In the example above, calibration control logic 18 would adjust the PLL proportional path signal downward if the measured phase deviation error value were less than 14 and upward if the measured phase deviation error value were greater than 14. Calibration control logic 18 can continue adjusting the PLL proportional path adjustment signal in this manner until it yields a measured phase deviation error value corresponding to −3 dB.

When the comparison process indicated by block 54 indicates that the PLL proportional path adjustment signal yields a measured phase deviation error value corresponding to −3 dB, calibration control logic 18 saves (e.g., stores in a memory) that value of the PLL proportional path adjustment signal, as indicated by block 56. Calibration control logic 18 may thereafter continue to apply that value of the PLL proportional path adjustment signal to PLL 20 until a power-on or other event of the type described above triggers calibration control logic 18 to begin the calibration method again.

When the PLL proportional path adjustment signal value has been determined as described above with regard to blocks 48-56, calibration control logic 18 can set PLL peaking to a target or desired value. As indicated by block 58, calibration control logic 18 can cause clock phase modulator 14 to decrease the modulation frequency by a suitable increment. As indicated by block 60, calibration control logic 18 can then measure the phase deviation error as described above.

If calibration control logic 18 determines, as indicated by block 62, that the measured phase deviation error value has either increased or remained at the same value since the modulation frequency was last decreased (block 58), then calibration control logic 18 again decreases the modulation frequency (block 58). Initially, the amount of phase deviation error will increase as the frequency is decreased. However, there will be an inflection point where further decreases in modulation frequency do not result in an increase in phase deviation error but rather result in a decrease in phase deviation error (i.e., an inflection point in the phase deviation error measurement). Thus, if calibration control logic 18 determines, as indicated by block 62, that the measured phase deviation error value has decreased, the inflection point in modulation frequency has been reached. At that point, calibration control logic 18 ceases to decreases the modulation frequency and begins to adjust the PLL integral path adjustment signal ("INT_ADJ") to adjust PLL peaking.

As indicated by block 64, calibration control logic 18 adjusts the PLL integral path adjustment signal. As indicated by block 66, with the PLL integral path adjustment signal adjusted to a certain value, calibration control logic 18 measures the resulting phase deviation error as described above. The PLL integral path adjustment signal will yield the target amount of PLL peaking when the measured phase deviation error value divided by the peak-to-peak amplitude ("2A") equals the target peaking value. That is, the measured phase deviation error value divided by 2A corresponds to the amount of PLL peaking.

As indicated by block 68, calibration control logic 18 determines if the computed peaking value (i.e., the measured phase deviation error value divided by 2A) corresponds to the target amount of PLL peaking. If the computed peaking value does not correspond to the target amount of PLL peaking, then calibration control logic 18 again adjusts the PLL integral path adjustment signal (block 64). Although not shown for purposes of clarity, persons skilled in the art will understand that calibration control logic 18 can adjust the PLL integral path adjustment signal up or down by a suitable increment, depending upon the result of the comparison indicated by block 68. That is, although for purposes of clarity block 68 indicates a straightforward comparison for equality of two values, persons skilled in the art understand that the comparison can result in a determination of whether the computed peaking value is greater than the target amount of peaking, less than the target amount of peaking, or (substantially) equal to the target amount of peaking. If the computed peaking value is greater than the target amount of peaking, then the next adjustment of the PLL integral path adjustment signal indicated by block 64 would be upward because the computed peaking value is below the target amount of peaking. If the computed peaking value is less than the target amount of peaking, then the next adjustment of the PLL integral path adjustment signal indicated by block 64 would be downward because the computed peaking value is above the target amount of peaking. Calibration control logic 18 can continue adjusting the PLL integral path adjustment signal in this manner until it yields a computed peaking value corresponding to the target amount of PLL peaking.

When the comparison process indicated by block 68 indicates that the PLL integral path adjustment signal yields a computed peaking value corresponding to the target amount of PLL peaking, calibration control logic 18 saves (e.g., stores in a memory) that value of the PLL integral path adjustment signal, as indicated by block 70. Calibration control logic 18 may thereafter continue to apply that value of the PLL integral path adjustment signal to PLL 20 until a power-on or other event of the type described above triggers calibration control logic 18 to begin the calibration method again.

Although not shown for purposes of clarity, after the calibration method has been completed, the system shown in FIGS. 2-3 can be switched from the calibration mode to the normal operational mode in the manner described above. In normal operational mode, PLL 20 thus receives the PLL proportional path adjustment signal that yields the target PLL bandwidth, and receives the PLL integral path adjustment signal that yields the target amount of PLL peaking.

One or more illustrative or exemplary embodiments of the invention have been described above. However, it is to be understood that the invention is defined by the appended claims and is not limited to the specific embodiments described.

What is claimed is:

1. A system for calibrating a phase-locked loop (PLL), the PLL comprising phase detection circuitry, voltage-controlled oscillator (VCO) circuitry, and a feedback loop having frequency division circuitry coupling an output of the VCO circuitry to an input of the phase detection circuitry, the system comprising:

a clock phase modulator configured to phase-modulate an input reference clock signal at a modulation frequency and to provide a phase-modulated reference clock signal to the PLL;

a PLL output signal sampler configured to digitally sample a PLL output signal generated by the VCO circuitry of the PLL in response to the phase-modulated reference clock signal and to provide digital information indicating variation in the PLL output signal corresponding to an amount of phase modulation in the phase-modulated reference clock signal; and calibration control logic configured to provide a measurement of phase deviation error in the PLL output signal in response to the digital information indicating variation in the PLL output signal and configured to provide calibration signals to the PLL in response to the measurement of phase deviation error and at least one target PLL parameter provided as a calibration input.

2. The system of claim 1, wherein the at least one target PLL parameter comprises at least one of a target PLL bandwidth and a target PLL peaking.

3. The system of claim 1, wherein the clock phase modulator comprises:
a delay-locked loop driven by the input reference clock signal and producing a sequence of delayed clock signals;
a multiplexer having a plurality of inputs receiving a corresponding plurality of the delayed clock signals; and
multiplexer selection logic configured to control the multiplexer to select a sinusoidally varying sequence of the delayed clock signals.

4. The system of claim 3, wherein the PLL output signal sampler comprises:
a plurality of flip-flops, each flip-flop of the plurality of flip-flops sampling the PLL output signal in response to a corresponding one of the delayed clock signals; and
combinational logic configured to produce the digital information indicating the variation in the PLL output signal in response to outputs of the plurality of flip-flops.

5. The system of claim 4, wherein the variation in the PLL output signal comprises variation between a maximum lead of an edge of the PLL output signal ahead of a corresponding edge of the input reference clock signal and a maximum lag of the edge of the PLL output signal behind the corresponding edge of the input reference clock signal.

6. The system of claim 5, wherein the combinational logic comprises:
a plurality of exclusive-OR gates, an $n^{th}$ exclusive-OR gate of the plurality of exclusive-OR gates having a first input coupled to an output of an $n^{th}$ flip-flop of the plurality of flip-flops that receives an $n^{th}$ delayed clock signal in the sequence of delayed clock signals and having a second input coupled to an output of an $(n+1)^{th}$ flip-flop of the plurality of flip-flops that receives an $(n+1)^{th}$ delayed clock signal in the sequence of delayed clock signals, where n is an index integer for the sequence of delayed clock signals; and
a plurality of AND gates, an $n^{th}$ AND gate of the plurality of AND gates having a first input coupled to an output of the $n^{th}$ exclusive-OR gate and a second input coupled to the output of the $(n+1)^{th}$ flip-flop.

7. The system of claim 6, wherein the PLL output signal sampler further comprises a register configured to store outputs of the plurality of AND gates.

8. The system of claim 6, wherein:
the digital information comprises bit positions indicated by outputs of the plurality of AND gates, a difference in a number of bit positions between a first bit position of a "1" bit provided at an output of a first AND gate of the plurality of AND gates and a second bit position of a "1" provided at an output of a second AND gate of the plurality of AND gates; and
the calibration control logic provides the measurement of phase deviation error in the PLL output signal by determining the difference in the number of bit positions.

9. The system of claim 8, wherein:
the at least one target PLL parameter comprises a target PLL 3 decibel (3dB) bandwidth;
the calibration signals comprise a proportional path adjustment signal; and
the calibration control logic is configured to continue to adjust the proportional path adjustment signal while the modulation frequency is set to a target modulation frequency corresponding to the target 3 dB bandwidth until the calibration control logic determines the measurement of phase deviation error in the PLL output signal substantially equals 3 dB of PLL output signal peak-to-peak amplitude.

10. The system of claim 8, wherein:
the at least one target PLL parameter comprises a target PLL peaking;
the calibration signals comprise an integral path adjustment signal; and
the calibration control logic is configured to continue to adjust the integral path adjustment signal while the modulation frequency is set a modulation frequency corresponding to an inflection point in the PLL frequency response until the calibration control logic determines the measurement of phase deviation error in the PLL output signal substantially corresponds to the target PLL peaking.

11. The system of claim 10, wherein the calibration control logic determines the inflection point in the PLL frequency response by continuing to adjust the modulation frequency until the calibration control logic detects an inflection point in the measurement of phase deviation error in the PLL output signal.

12. The system of claim 8, wherein:
the at least one target PLL parameter comprises a target PLL 3 decibel (3dB) bandwidth and a target amount of PLL peaking;
the calibration signals comprise a proportional path adjustment signal and an integral path adjustment signal;
the calibration control logic is configured to continue to adjust the proportional path adjustment signal while the modulation frequency is set to a target modulation frequency corresponding to the target 3 dB bandwidth until the calibration control logic determines the measurement of phase deviation error in the PLL output signal substantially equals 3 dB of PLL output signal peak-to-peak amplitude; and
the calibration control logic is further configured to continue to adjust the integral path adjustment signal while the modulation frequency is set a modulation frequency corresponding to an inflection point in a PLL frequency response until the calibration control logic determines the measurement of phase deviation error in the PLL output signal substantially corresponds to the target amount of PLL peaking.

13. A method for calibrating a phase-locked loop (PLL), the PLL comprising phase detection circuitry, voltage-controlled oscillator (VCO) circuitry, and a feedback loop having frequency division circuitry coupling an output of the VCO circuitry to an input of the phase detection circuitry, the method using a calibration circuit comprising a clock phase modulator configured to provide a phase-modulated reference clock signal to the PLL and a PLL output signal sampler configured to digitally sample a PLL output signal generated by the VCO circuitry of the PLL in response to the phase-modulated reference clock signal and to provide digital information indicating variation in the PLL output signal corresponding to an amount of phase modulation in the phase-modulated reference clock signal, the method comprising:
coupling an input of the PLL output signal sampler to the output of the VCO circuitry to digitally sample the PLL output signal;
setting the clock phase modulator to provide a phase-modulated reference clock signal having a modulation frequency corresponding to a target 3 dB bandwidth of the PLL; and providing a proportional path adjustment signal to a proportional path adjustment input of the PLL by continuing to adjust the proportional path adjustment signal and determine a measurement of phase deviation error in the PLL output signal from the digital information until it is determined that the measurement of phase deviation error in the PLL output signal substantially equals 3 dB of PLL output signal peak-to-peak amplitude.

14. The method of claim 13, wherein the clock phase modulator comprises:
a delay-locked loop driven by the input reference clock signal and producing a sequence of delayed clock signals;
a multiplexer having a plurality of inputs receiving a corresponding plurality of the delayed clock signals; and
multiplexer selection logic configured to control the multiplexer to select a sinusoidally varying sequence of the delayed clock signals.

15. A method for calibrating a phase-locked loop (PLL), the PLL comprising phase detection circuitry, voltage-controlled oscillator (VCO) circuitry, and a feedback loop having frequency division circuitry coupling an output of the VCO circuitry to an input of the phase detection circuitry, the method using a calibration circuit comprising a clock phase modulator configured to provide a phase-modulated reference clock signal to the PLL and a PLL output signal sampler configured to digitally sample a PLL output signal generated by the VCO of the PLL in response to the phase-modulated reference clock signal and to provide digital information indicating variation in the PLL output signal corresponding to an amount of phase modulation in the phase-modulated reference clock signal, the method comprising:
coupling an input of the PLL output signal sampler to the output of the VCO circuitry to digitally sample the PLL output signal;
adjusting the clock phase modulator to provide a phase-modulated reference clock signal having a modulation frequency corresponding to an inflection point in a PLL frequency response; and
providing an integral path adjustment signal to an integral path adjustment input of the PLL by continuing to adjust the integral path adjustment signal and determine a measurement of phase deviation error in the PLL output signal from the digital information until it is determined that the measurement of phase deviation error in the PLL output signal substantially corresponds to a target amount of PLL peaking.

16. The method of claim 15, wherein adjusting the clock phase modulator to provide a phase-modulated reference clock signal having a modulation frequency corresponding to an inflection point in a PLL frequency response comprises:
continuing to adjust the clock phase modulator to adjust the modulation frequency until it is determined that the measurement of phase deviation error in the PLL output signal increases in response to a further decrease in modulation frequency and decreases in response to a further increase in modulation frequency.

17. The method of claim 15, wherein the clock phase modulator comprises:
a delay-locked loop driven by the input reference clock signal and producing a sequence of delayed clock signals;
a multiplexer having a plurality of inputs receiving a corresponding plurality of the delayed clock signals; and
multiplexer selection logic configured to control the multiplexer to select a sinusoidally varying sequence of the delayed clock signals.

18. A method for calibrating a phase-locked loop (PLL), the PLL comprising phase detection circuitry, voltage-controlled oscillator (VCO) circuitry, and a feedback loop having frequency division circuitry coupling an output of the VCO circuitry to an input of the phase detection circuitry, the method using a calibration circuit comprising a clock phase modulator configured to provide a phase-modulated reference clock signal to the PLL and a PLL output signal sampler configured to digitally sample a PLL output signal generated by the PLL in response to the phase-modulated reference clock signal and to provide digital information indicating variation in the PLL output signal corresponding to an amount of phase modulation in the phase-modulated reference clock signal, the method comprising:
coupling an input of the PLL output signal sampler to the output of the VCO circuitry to digitally sample the PLL output signal;
setting the clock phase modulator to provide a phase-modulated reference clock signal having a modulation frequency corresponding to a target 3 dB bandwidth of the PLL; and
providing a proportional path adjustment signal to a proportional path adjustment input of the PLL by continuing to adjust the proportional path adjustment signal and determine a measurement of phase deviation error in the PLL output signal from the digital information until it is determined that the measurement of phase deviation error in the PLL output signal substantially equals 3 dB of PLL output signal peak-to-peak amplitude;
adjusting the clock phase modulator to provide a phase-modulated reference clock signal having a modulation frequency corresponding to an inflection point in a PLL frequency response; and
providing an integral path adjustment signal to an integral path adjustment input of the PLL by continuing to adjust the integral path adjustment signal and determine a measurement of phase deviation error in the PLL output signal from the digital information until it is determined that the measurement of phase deviation error in the PLL output signal substantially corresponds to a target amount of PLL peaking.

19. The method of claim 18, wherein adjusting the clock phase modulator to provide a phase-modulated reference clock signal having a modulation frequency corresponding to an inflection point in a PLL frequency response comprises:
continuing to adjust the clock phase modulator to adjust the modulation frequency until it is determined that the measurement of phase deviation error in the PLL output signal increases in response to a further decrease in modulation frequency and decreases in response to a further increase in modulation frequency.

20. The method of claim 18, wherein the clock phase modulator comprises:
a delay-locked loop driven by the input reference clock signal and producing a sequence of delayed clock signals;
a multiplexer having a plurality of inputs receiving a corresponding plurality of the delayed clock signals; and
multiplexer selection logic configured to control the multiplexer to select a sinusoidally varying sequence of the delayed clock signals.

* * * * *